United States Patent
Ko

(10) Patent No.: US 11,133,193 B2
(45) Date of Patent: Sep. 28, 2021

(54) PLASMA PROCESSING DEVICE AND METHOD OF ADJUSTING AN EDGE RING OF A PLASMA PROCESSING DEVICE

(71) Applicant: XIA TAI XIN SEMICONDUCTOR (QING DAO) LTD., Qingdao (CN)

(72) Inventor: Yongchul Ko, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/748,997

(22) Filed: Jan. 22, 2020

(65) Prior Publication Data
US 2021/0118685 A1 Apr. 22, 2021

(30) Foreign Application Priority Data
Oct. 22, 2019 (CN) .......................... 201911008329.1

(51) Int. Cl.
*H01L 21/3065* (2006.01)
*H01L 21/683* (2006.01)
*H01J 37/32* (2006.01)

(52) U.S. Cl.
CPC .... *H01L 21/3065* (2013.01); *H01J 37/32642* (2013.01); *H01J 37/32697* (2013.01); *H01L 21/6833* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2017/0213758 A1* | 7/2017 | Rice | H01J 37/32091 |
| 2017/0263478 A1* | 9/2017 | McChesney | H01J 37/32623 |
| 2017/0287682 A1* | 10/2017 | Musselman | H01L 21/681 |
| 2018/0053629 A1* | 2/2018 | Zhang | H01J 37/32082 |
| 2020/0335368 A1* | 10/2020 | Pan | H01J 37/3288 |
| 2020/0395195 A1* | 12/2020 | Sanchez | H01J 37/32642 |

\* cited by examiner

*Primary Examiner* — Shamim Ahmed
(74) *Attorney, Agent, or Firm* — ScienBiziP, P.C.

(57) ABSTRACT

A plasma processing device includes an electrostatic chuck supporting a wafer, a base ring surrounding the electrostatic chuck, an edge ring disposed on the base ring, a lift assembly comprising at least one lift pin and at least one driver, and a sensor. Each lift pin movably passes through the base ring to lift the edge ring which is subject to being corroded during a plasma process. The driver is connected to the at least one lift pin to drive the lift pin to move upwards and downwards. The sensor is disposed between the driver and the lift pin to detect a weight of the edge ring when the lift pin raises the edge ring to a preset position as a difference in weight indicates loss of edge ring material due to corrosion.

8 Claims, 4 Drawing Sheets

PLASMA PROCESSING DEVICE AND METHOD OF ADJUSTING AN EDGE RING OF A PLASMA PROCESSING DEVICE

FIELD

The subject matter herein generally relates to a semiconductor processing device and a method of using the same, and more particularly to a plasma processing device and a method of adjusting an edge ring of the plasma processing device.

BACKGROUND

In the manufacture of a semiconductor element, etching, depositing, and cleaning a substrate are processes often performed by plasma. Edge rings are also often used in some plasma processes, and corrosion of the edge rings increases as the plasma device is used. When the corrosion of the edge ring reaches a certain level, in order to ensure the effectiveness of plasma processing, the edge ring needs to be replaced.

BRIEF DESCRIPTION OF THE DRAWINGS

Implementations of the present disclosure will now be described, by way of embodiments, with reference to the attached figures.

DETAILED DESCRIPTION

Figure 1:
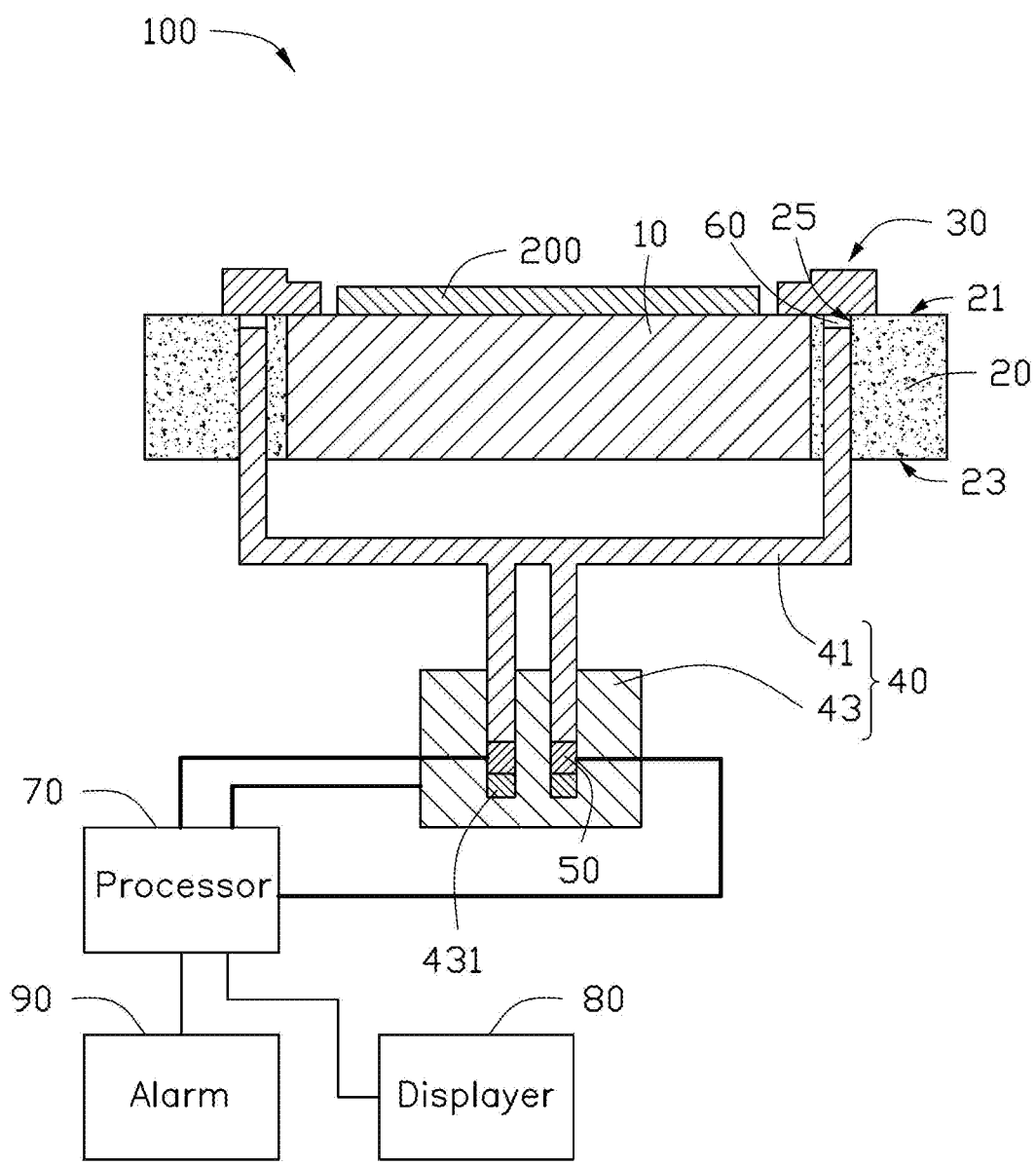
FIG. 1 is a cross-sectional view of an embodiment of a plasma processing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates an embodiment of a plasma processing device 100. The plasma processing device 100 includes an electrostatic chuck 10, a base ring 20, an edge ring 30, a lift assembly 40, and a sensor 50.

The electrostatic chuck 10 supports a substrate 200 undergoing processing, the substrate 200 may be a wafer for example. The base ring 20 surrounds the electrostatic chuck 10. The edge ring 30 is disposed on the base ring 20. In some embodiments, the edge ring 30 is located on an upper surface 21 of the base ring 20, surrounds the substrate 200, and extends toward the substrate 200.

In some embodiments, the electrostatic chuck 10 may be made of aluminum oxide, the base ring 20 may be made of a ceramic material. In some embodiments, the electrostatic chuck 10 and the base ring 20 may be made of other materials.

The base ring 20 further includes a lower surface 23 facing away from the upper surface 21. At least one through hole 25 is defined to penetrate the upper surface 21 and the lower surface 23. Each through hole 25 is arranged corresponding to the edge ring 30.

The lift assembly 40 includes at least one lift pin 41 and at least one driver 43. Each lift pin 41 can be movably passed through the through hole 25. The at least one driver 43 is connected to the at least one lift pin 41 to drive the at least one lift pin 41 to move upwards and downwards along the through hole 25, thereby controlling the edge ring 30 to rise and fall. A connection between the at least one driver 43 and the at least one lift pin 41 may be a direct connection or an indirect connection. Specifically, the at least one driver 43 may drive the at least one lift pin 41 by lift rods 431 or by air pressure.

The sensor 50 is disposed between the at least one driver 43 and the at least one lift pin 41, and the sensor 50 detects a weight of the edge ring 30 when the edge ring 30 is raised to a preset position by the at least one lift pin 41. In some embodiments, the preset position is above the upper surface 21 of the base ring 20. In some embodiments, the preset position is spaced from the upper surface 21. In some embodiments, the preset position and the upper surface 21 are not arranged at the same plane. In some embodiments, the sensor 50 is located under a bottom of the at least one lift pin 41.

In some embodiments, a gap 60 is defined between each lift pin 41 and the edge ring 30 when the at least one lift pin 41 is at a starting position. Preferably, a distance of the gap 60 is 0.5-1.0 cm when the at least one lift pin 41 is at a starting position.

In some embodiments, the lift assembly 40 includes at least two lift pins 41 and the lift pins 41 are integrally formed. In some embodiments, the lift pins 41 may be independent of each other. In this illustrated embodiment, the lift pins 41 are integrally formed.

In some embodiments, the plasma processing device 100 may further include a processor 70. The processor 70 is electrically connected to the at least one driver 43 and the sensor 50. The processor 70 controls the at least one driver 43 to drive the at least one lift pin 41 to move upwards and downwards, thereby controlling the edge ring 30 to rise and fall. The processor 70 also receives signals as to the weight of the edge ring 30, detected by the sensor 50.

The plasma processing device 100 may further include a displayer 80 for displaying the weight of the edge ring 30, so that a user may determine whether to replace the edge ring 30 according to the weight of the edge ring 30 displayed by the displayer 80, and also may be warned in advance to determine how long it will take before replacing the edge ring 30.

The plasma processing device 100 may further include an alarm 90. The alarm 90 may be a voice alarm device, a light alarm device, or a combination of both. The alarm 90 is electrically connected to the processor 70. The processor 70 compares the received weight of the edge ring 30 detected by the sensor 50 with a preset value. If the detected weight is less than or equal to the preset value, the processor 70 controls the alarm 90 to remind a user to replace the edge ring 30.

In some embodiments, at least one groove (not shown) is formed on the edge ring 30. Each groove is arranged corresponding to one lift pin 41. The driver 43 drives the lift pin 41 to move upwards and then be received in the groove to drive the edge ring 30 to move.

In some embodiments, the driver 43 may be a stepper motor.

Figure 2:
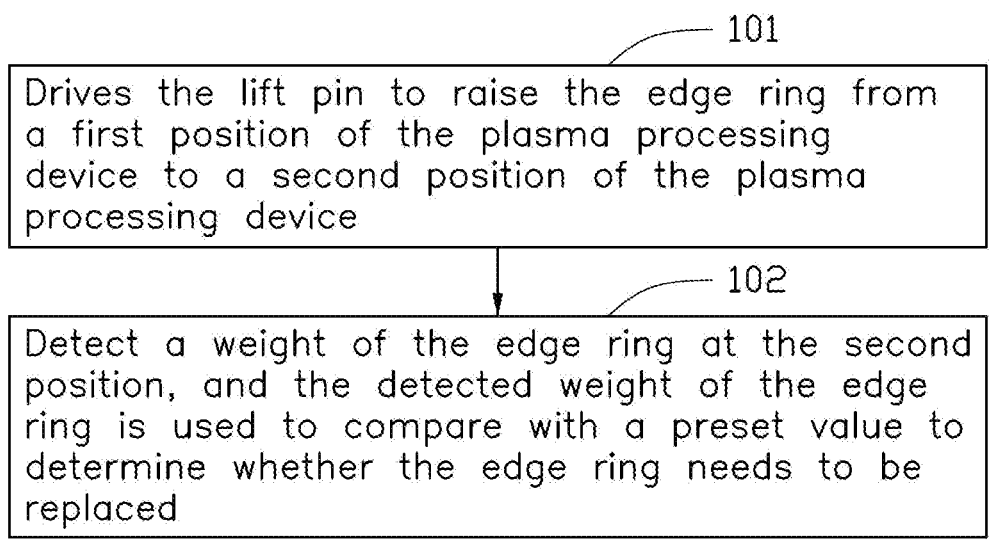
FIG. 2 is a flowchart of an embodiment of a method of adjusting an edge ring of a plasma processing device.

FIG. 2 illustrates a flowchart of a method in accordance with an embodiment. The method of adjusting the edge ring 30 of the plasma processing device 100 (shown in FIG. 1) is provided by way of embodiments, as there are a variety of ways to carry out the method. Each block shown in FIG. 2 represents one or more processes, methods, or subroutines carried out in the method. Furthermore, the illustrated order of blocks can be changed. Additional blocks may be added or fewer blocks may be utilized, without departing from this disclosure. The method can begin at block 101.

Figure 3:
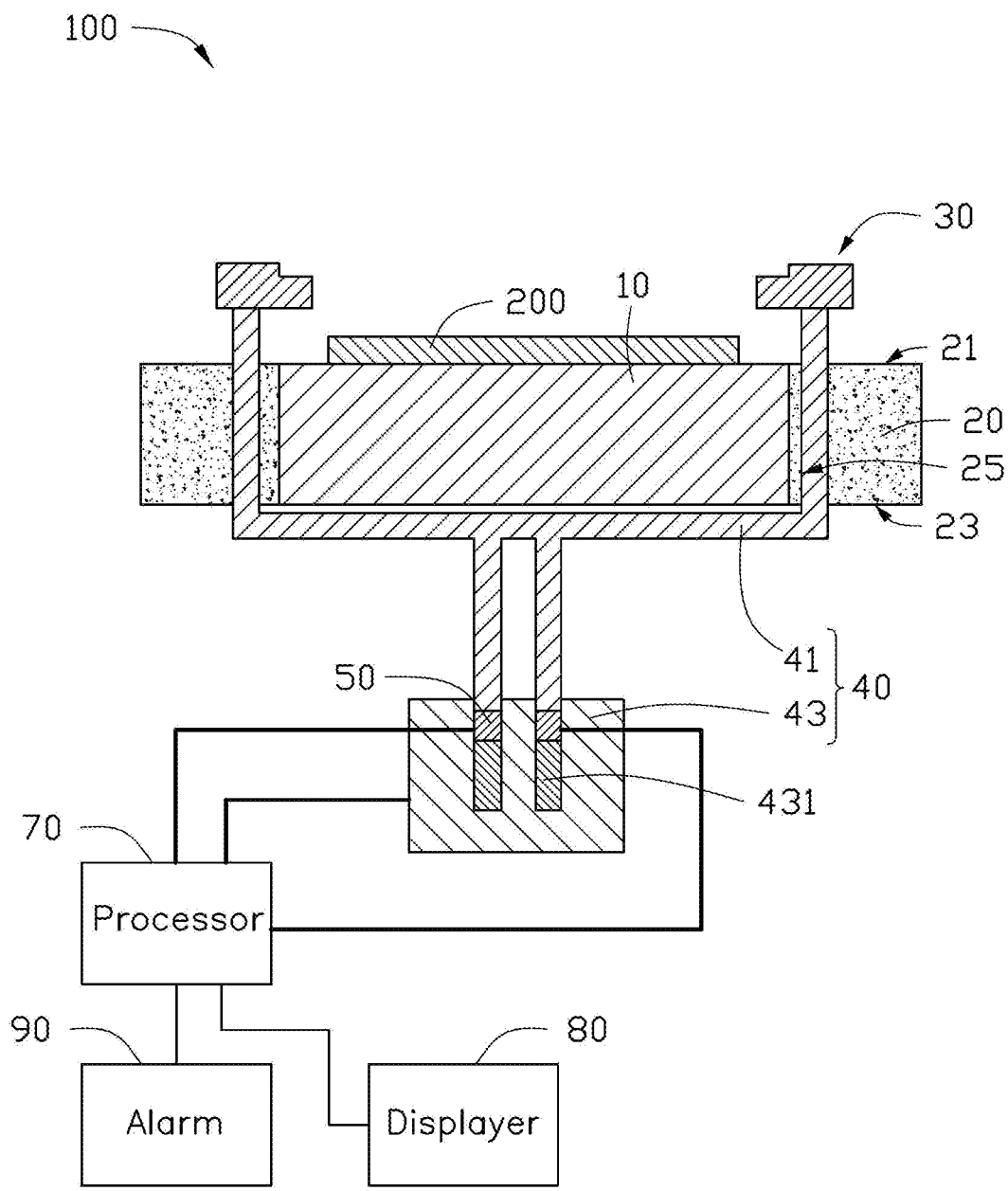
FIG. 3 is a cross-sectional view of an embodiment of the plasma processing device of FIG. 1 in another state.

At block 101, referring to FIG. 3, the driver 43 drives the lift pin 41 to raise the edge ring 30 from a first position of the plasma processing device 100 to a second position of the plasma processing device 100.

In some embodiments, the first position may be that the edge ring 30 is located on the upper surface 21 of the base ring 20.

At block 102, the sensor 50 detects a weight of the edge ring 30 at the second position, and the detected weight of the edge ring 30 is compared with a preset value to determine whether the edge ring 30 needs to be replaced.

In some embodiments, the preset value may be 50% to 70% of an initial weight of the edge ring 30. In some embodiments, the preset value may be varied as needed.

When the plasma processing device 100 includes the processor 70, the processor 70 compares the detected weight of the edge ring 30 with the preset value to determine whether the edge ring 30 needs to be replaced. If the detected weight of the edge ring 30 is less than or equal to the preset value, the edge ring 30 needs to be replaced.

Figure 4:
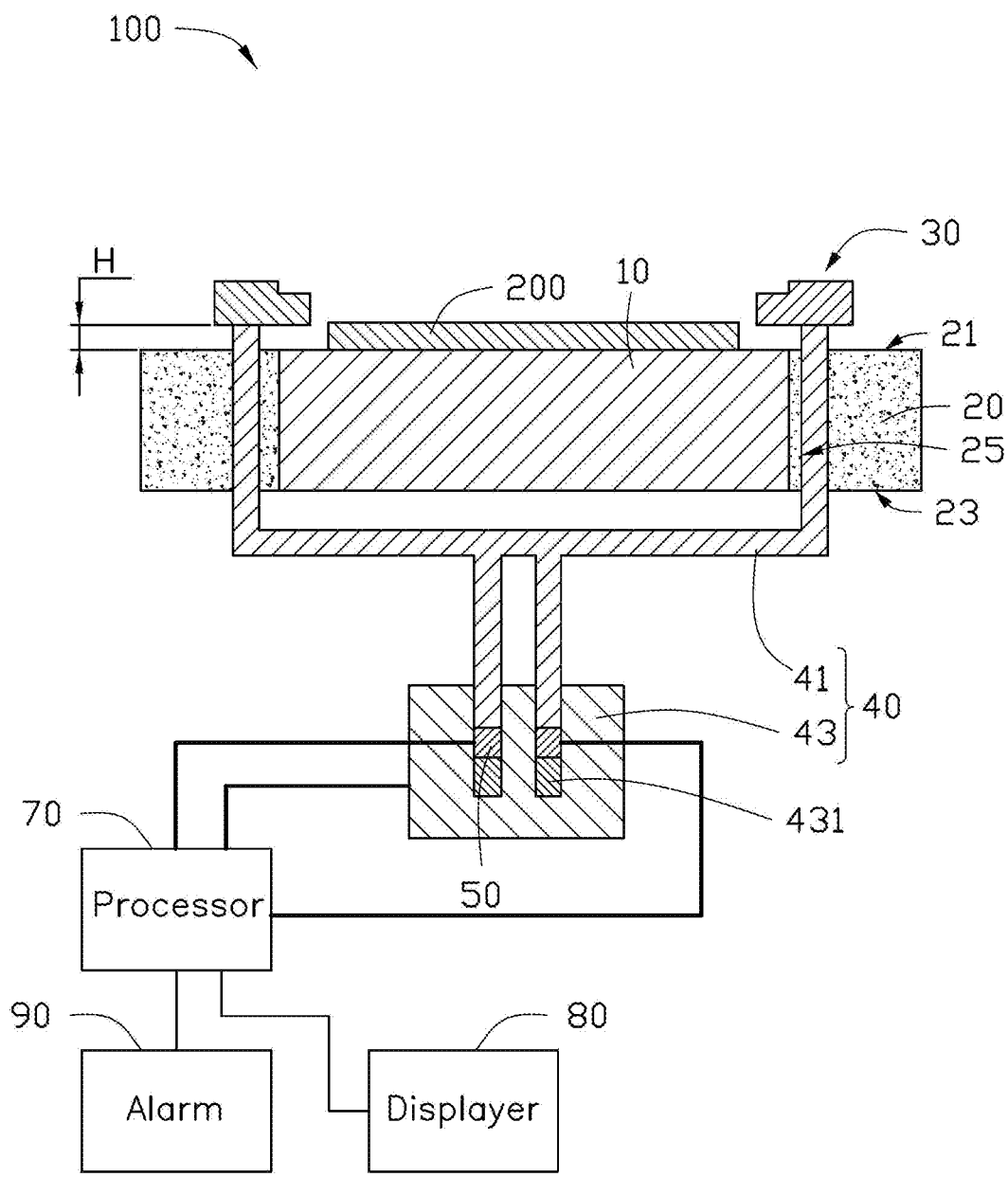
FIG. 4 is a cross-sectional view of an embodiment of the plasma processing device of FIG. 1 in yet another state.

When the detected weight of the edge ring 30 is greater than the preset value, the processor 70 acquires a compensatory height H according a preset relationship between the detected weight of the edge ring 30 and the compensatory height H. Referring to FIG. 4, the processor 70 controls the driver 43 to drive the lift pin 41 to move the edge ring 30 to a third position according to the acquired compensatory height H. The third position is higher than the first position, and a height difference between the third position and the first position is equal to the acquired compensatory height H, thereby compensating for a corrosion-loss of the edge ring 30 when the substrate 200 is processed.

In some embodiments, the preset relationship between the detected weight and the compensatory height H is stored. The preset relationship between the detected weight and the compensatory height H can be a relationship between the compensatory height H and a ratio of the detected weight to the initial weight of the edge ring. The compensatory height H refers to a distance between a lower surface of the edge ring 30 and the upper surface 21 of the base ring 20. That is, the compensatory height H is the height difference between the third position and the first position. The compensatory height H may ensure uniform plasma function when the substrate 200 is being processed by the plasma processing device 100 with the etched edge ring 30. For example, the preset relationship may be a correspondence of the following table 1:

TABLE 1

| The ratio of the detected weight to the initial weight of the edge ring | The compensatory height H |
|---|---|
| 100% | 0 |
| 95% | 0.1 mm |
| 90% | 0.2 mm |
| . . . | . . . |
| 75% | 0.5 mm |

In some embodiments, when the detected weight of the edge ring 30 is greater than the preset value, the processor 70 controls the driver 45 to drive the lift pin 41 to allow the edge ring 30 to fall from the second position to the first position.

Further, the processor 70 acquires the compensatory height H according the preset relationship between the detected weight of the edge ring 30 and the compensatory height H, and then controls the driver 43 to drive the lift pin 41 to raise the edge ring 30 from the first position to the third position according the acquired compensatory height H. The height difference between the third position and the first position is the acquired compensatory height H.

In some embodiments, when the detected weight of the edge ring 30 is greater than the preset value, the processor 70 acquires the compensatory height H according to the preset relationship between the detected weight of the edge ring 30 and the compensatory height H, and then controls the driver 43 to drive the lift pin 41 to allow the edge ring 30 to fall from the second position to the third position according to the acquired compensatory height H. The third position is higher than the first position. The height difference between the third position and the first position is the acquired compensatory height H.

In some embodiments, when the detected weight of the edge ring 30 is less than or equal to the preset value, the processor 70 controls the driver 43 to drive the lift pin 41 to allow the edge ring 30 to fall from the second position to the first position, then the edge ring 30 is replaced at the first position.

In some embodiments, when the detected weight of the edge ring 30 is less than or equal to the preset value, the edge ring 30 is replaced at the second position.

In some embodiments, when the detected weight of the edge ring 30 is less than or equal to the preset value, the processor 70 controls the alarm 90 to remind a user to replace the edge ring 30.

The sensor 50 is disposed between the lift pin 41 and the driver 43 to detect the weight of the edge ring 30 at regular or irregular intervals, thereby avoiding removal of the edge ring 30 for weighing purposes. So that the production efficiency may be increased. In addition, the edge ring 30 or the plasma processing device 100 may be prevented from being damaged when the edge ring 30 is taken out.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method of adjusting an edge ring of a plasma processing device comprising:

raising an edge ring from a first position of the plasma processing device to a second position of the plasma processing device by a lift assembly of the plasma processing device; wherein the lift assembly comprises at least one lift pin and at least one driver;

detecting a weight of the edge ring at the second position by a sensor of the plasma processing device, wherein the sensor is disposed between the at least one driver and the at least one lift pin;

comparing the detected weight with a preset value, and replacing the edge ring if the detected weight is less than or equal to the preset value; determining a compensatory height according a preset relationship between the detected weight of the edge ring and the compensatory height if the detected weight is greater than the preset value, and then moving the edge ring to a third position based on the compensatory height by the lift assembly, the third position being higher than the first position.

2. The method of the claim 1, further comprising:
descending the edge ring from the second position to the first position by the lift assembly when the detected weight is greater than the preset value.

3. The method of the claim 2, wherein after descending the edge ring, the method further comprises:
determining a compensatory height according a preset relationship between the detected weight of the edge ring and the compensatory height; and
raising the edge ring from the first position to a third position based on the compensatory height by the lift assembly.

4. The method of the claim 1, further comprising:
determining a compensatory height according a preset relationship between the detected weight of the edge ring and the compensatory height if the detected weight is greater than the preset value; and
descending the edge ring from the second position to a third position by the lift assembly, wherein the third position is higher than the first position by the compensatory height.

5. The method of the claim 1, wherein before replacing the edge ring if the detected weight is less than or equal to the preset value, the method further comprises:
descending the edge ring from the second position to the first position by the lift assembly.

6. The method of the claim 1, wherein the edge ring is replaced when the edge ring is positioned at the second position by the lift assembly if the detected weight is less than or equal to the preset value.

7. The method of the claim 1, wherein the edge ring has an initial weight, and the preset value is 50% to 70% of the initial weight.

8. The method of the claim 1, wherein the method of raising an edge ring from a first position of the plasma processing device to a second position of the plasma processing device by a lift assembly of the plasma processing device comprises:
providing a lift assembly of the plasma processing device comprising at least one driver and at least two lift pins, wherein the at least two lift pins are integrally formed with each other, the at least one driver drives the at least two lift pins to move upwards and downwards; and
raising an edge ring from a first position of the plasma processing device to a second position of the plasma processing device by moving the at least two lift pins upwards together.

* * * * *